United States Patent
Huang et al.

(10) Patent No.: US 7,320,855 B2
(45) Date of Patent: Jan. 22, 2008

(54) SILICON CONTAINING TARC/BARRIER LAYER

(75) Inventors: Wu-Song S. Huang, Poughkeepsie, NY (US); Sean D. Burns, Yorktown Heights, NY (US); Pushkara Rao Varanasi, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 80 days.

(21) Appl. No.: 10/980,365

(22) Filed: Nov. 3, 2004

(65) Prior Publication Data

US 2006/0093959 A1   May 4, 2006

(51) Int. Cl.
G03F 7/36 (2006.01)
G03F 7/20 (2006.01)
G03F 7/09 (2006.01)
G03C 1/825 (2006.01)

(52) U.S. Cl. .................. 430/311; 430/325; 430/326; 430/313; 430/316; 430/317; 430/318

(58) Field of Classification Search ............ None
See application file for complete search history.

(56) References Cited

U.S. PATENT DOCUMENTS

| | | | |
|---|---|---|---|
| 5,744,537 A | 4/1998 | Brunsvold et al. | 524/520 |
| 6,057,080 A | 5/2000 | Brunsvold et al. | 430/273.1 |
| 6,503,689 B2 | 1/2003 | Zampini et al. | 430/270.1 |
| 2003/0198877 A1* | 10/2003 | Pfeiffer et al. | 430/15 |
| 2003/0211417 A1 | 11/2003 | Fryd et al. | 430/270.1 |
| 2004/0013971 A1 | 1/2004 | Berger et al. | 430/270.1 |
| 2004/0033436 A1 | 2/2004 | Berger et al. | 430/270.1 |
| 2005/0079443 A1* | 4/2005 | Noda et al. | 430/270.1 |
| 2005/0089792 A1* | 4/2005 | Huang et al. | 430/270.1 |
| 2005/0106494 A1* | 5/2005 | Huang et al. | 430/270.1 |

OTHER PUBLICATIONS

"Exploring the Needs and Tradeoffs for Immersion Resist Topcoating" Mark Slezak, Zhi Liu, Raymond Hung, JSR Micro Inc. Solid State Technology, Jul. 2004, pp. 91-92, 96-97.
U.S. Appl. No. 10/855,045, Entitled: Top Coat Material and Use Thereof in Lithography Processes.
U.S. Appl. No. 10/855,045, filed May 27, 2004, Entitled: Top Coat Material and Use Thereof in Lithography Processes.

* cited by examiner

*Primary Examiner*—Sin Lee
(74) *Attorney, Agent, or Firm*—Steven Capella

(57) ABSTRACT

A top anti-reflective coating material (TARC) and barrier layer, and the use thereof in lithography processes, is disclosed. The TARC/barrier layer may be especially useful for immersion lithography using water as the imaging medium. The TARC/barrier layer comprises a polymer which comprises at least one silicon-containing moiety and at least one aqueous base soluble moiety. Suitable polymers include polymers having a silsesquioxane (ladder or network) structure, such as polymers containing monomers having the structure:

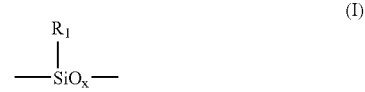

(I)

where $R_1$ comprises an aqueous base soluble moiety, and x is from about 1 to about 1.95, more preferably from about 1 to about 1.75.

13 Claims, No Drawings

SILICON CONTAINING TARC/BARRIER LAYER

BACKGROUND OF THE INVENTION

1. Field of the Invention

This invention relates to a top anti-reflective coating material (TARC) and barrier layer and the use thereof in lithography processes. This TARC/barrier layer may be especially useful for immersion lithography in which a liquid such as water is used as the exposure medium between the lens fixture of an exposure tool and the photoresist-coated wafer.

2. Description of the Related Art

Traditionally, top coat materials have been used in photolithography as anti-reflective films on the top of a photoresist. Top anti-reflective coating (TARC) materials can prevent the multiple interference of light that takes place within the photoresist layer during exposure. As a result, the critical dimension (CD) variation of the geometrical features of a photoresist pattern that is caused by the variation in the thickness of the photoresist film can be minimized.

To fully take advantage of the anti-reflective effect of the top coat, the refractive index of the top coat material ($n_r$) should be at about the square root of the multiplication of the refractive index of the exposure medium ($n_m$) and the refractive index of the underlying photoresist ($n_p$). If the exposure medium is air as in the case for "dry" lithography, the optimal refractive index of the top coat material ($n_r$) should be at about the square root of the refractive index of the underlying photoresist ($n_p$), because the refractive index of air is roughly 1. The TARC also requires transparency to the exposure light to prevent intensity loss of the light to the photoresist.

For ease of processing, classic TARC materials are designed to be soluble in both water and aqueous base developer so that they can be applied directly from water solution and subsequently removed by the aqueous base developer during the develop stage. Numerous top coat materials have been developed to meet these two requirements of optimal refractive index and solubility. For example, U.S. Pat. Nos. 5,744,537 and 6,057,080 disclose aqueous-soluble TARC materials comprising a polymeric binder and a fluorocarbon compound, and which have nearly ideal refractive indexes on the order of 1.3-1.4. U.S. Pat. No. 5,879,853 also discloses a TARC material that is removable by a wet process. U.S. Pat. No. 5,595,861 similarly discloses a TARC comprising partially fluorinated compounds, which can also be water soluble. U.S. Pat. No. 6,274,295 discloses a TARC material comprising a light absorbing compound having a wavelength of maximum absorption higher than an exposure wavelength used to expose the photoresist. This TARC can also be water-soluble. U.S. Pat. No. 5,240,812 discloses a protective material for use as an overcoat film for acid catalyzed resist composition to prevent contamination from vapors of organic and inorganic bases. While not specifically disclosed as being a TARC, the overcoat can also be water soluble. Other TARC materials include those disclosed in U.S. Pat. Nos. 5,744,537 and 6,057,080, U.S. Pat. No. 6,503,689, U.S. Patent Application Pub. No. 2003/0211417, U.S. Patent Application Pub. No. 2004/0013971, and U.S. Patent Application Pub. No. 2004/0033436.

Immersion lithography offers the potential to extend the use of optical lithography to print smaller features. In immersion lithography, air is replaced by a liquid medium such as water between the lens and the wafer. Use of a medium with an index of refraction higher than air results in a greater numerical aperature (NA) provided that the projection angle is kept the same in the medium, and therefore allows printing of smaller features.

Immersion lithography, however, has presented some concerns that certain components in the photoresist may leach out to the immersion medium and change the performance of the photoresist, or that the immersion medium may diffuse into the photoresist and affect the acid generation and may then interfere with the chemical amplification mechanism. Much effort has been devoted to modifying photoresist formulations to insure that the above-mentioned problems will not occur during the immersion exposure process, but no photoresist has been developed which is both compatible with water as the proposed immersion medium and has acceptable performance characteristics.

To alleviate these photoresist leaching and solubility problems in immersion lithography, a top coat material can be used between the immersion medium and the resist-coated wafer. Such top coat material can prevent photoresist components from leaching into the immersion medium, and can also prevent permeation of the immersion medium into the photoresist film. One of the requirements for the top coat material, of course, is its insolubility in the immersion medium. Preferably, the top coat material can also act as a TARC layer.

Water has been proposed as the immersion medium for 193 nm immersion lithography. Therefore, classic water-soluble TARC materials such as those described above can not be used as top coats for 193 nm immersion lithography. Moreover, since water has higher refractive index (1.437 at 193 nm) than air (~1 at 193 nm), the optimal refractive index for TARC materials used for 193 nm immersion lithography is also higher than that of classic TARCs.

Thus, there remains a need for a top coat material that is insoluble in water but soluble in aqueous base developer, and also has desired optical properties so that it can also be used as a TARC.

SUMMARY OF THE INVENTION

In a first aspect of the invention, a top antireflective coating and barrier layer material comprising a polymer is provided. The polymer comprises at least one silicon-containing moiety and at least one aqueous base soluble moiety. The polymer may illustratively comprise at least one monomer having the structure:

(I)

wherein $R_1$ comprises an aqueous base soluble moiety, and x is about 1 to about 1.95.

In a second aspect of the invention, a method of forming a patterned material layer on a substrate is provided. The method comprises: providing a substrate having a material layer on a surface thereof; depositing a photoresist composition on the substrate to form a photoresist layer on the material layer; applying a top antireflective coating and barrier layer material on the photoresist layer, thereby forming a coated substrate, the top antireflective coating and barrier layer material comprising at least one silicon-containing moiety and at least one aqueous base soluble moiety; patternwise exposing the coated substrate to imaging radiation; removing simultaneously the top antireflective coating and barrier layer material and portions of the photoresist layer from the coated substrate, thereby forming a patterned photoresist layer on the material layer; and transferring the photoresist layer pattern to the material layer.

DETAILED DESCRIPTION OF THE INVENTION

This invention is directed to a TARC/barrier layer which is easy to apply, transparent to 193 nm light, with proper n and k values to reduce reflectivity. Moreover, the TARC/barrier layer of this invention is preferably insoluble in water but soluble in developer, and therefore can be used as TARC/barrier layer in immersion lithography and removed in the develop stage.

The invention encompasses a top coat material comprising a polymer which comprises at least one silicon-containing moiety and at least one aqueous base soluble moiety. The top coat is preferably insoluble in water but soluble in aqueous base developer so that it can be used for immersion lithography, especially 193 nm immersion lithography. Additionally, the top coat material of the present invention can be adjusted to act as a TARC so that better process control of image formation can be achieved. For 193 nm immersion lithography using water as the exposure medium, the optimal refractive index for a TARC material is about 1.5 to 1.7.

The Si moieties in the polymer of this invention may be, for example, Si—Si, Si—C, Si—N or Si—O moieties. Preferred Si moieties are the SiO moieties. The polymer containing SiO moieties may be a polymer containing SiO moieties in the polymer backbone and/or in pendant groups. Preferably, the polymer contains SiO moieties in its backbone. The polymer is preferably an organosiloxane, more preferably an organosilsesquioxane. The polymer should have solution and film-forming characteristics conducive to forming a layer by conventional spin-coating.

In addition to the SiO moieties, the polymer also preferably contains a plurality of aqueous base soluble sites distributed alone the polymer for base soluble characteristics. Base soluble moieties may include hydroxyl, carboxylic acid, sulfonamide, dicarboxyimide, N-hydroxy dicarboxyimide, any other amino group or any imino group. Preferably, the base soluble moiety is a hydroxyl group, and more preferably a fluoroalcohol moiety.

Examples of suitable TARC/barrier layer polymers include polymers having a silsesquioxane (ladder or network) structure. Such polymers preferably contain monomers having the following structure:

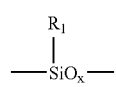
(I)

where $R_1$ comprises an aqueous base soluble moiety, and x is from about 1 to about 1.95, more preferably from about 1 to about 1.75.

The aqueous base soluble moiety in $R_1$ is preferably a hydroxyl or carboxylic acid moiety, more preferably a hydroxyl moiety, most preferably a fluoroalcohol. Other acceptable aqueous base soluble moieties in $R_1$ include sulfonamides, dicarboxyimides, N-hydroxy dicarboxyimides, any other amino groups or any imino groups. $R_1$ may also include fluorinated versions of such solubility promoting moieties.

The polymers described above most preferably contain monomers having the following structure:

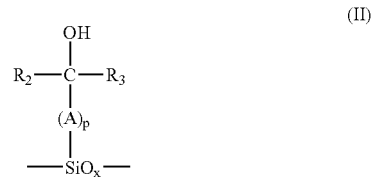
(II)

where:

each $R_2$ is independently selected from any of a fluorine, a fluorinated linear or branched alkyl, a fluorocycloalkyl, a fluoroaryl, and any combination thereof, and $R_2$ may optionally further include any of oxygen, sulfur or nitrogen;

each A is independently selected from any one of an oxygen atom, a sulfur atom, $NR_3$, a linear or branched alkyl, a linear or branched fluoroalkyl, a cycloalkyl or fluorocycloalkyl, and a fluoroaryl;

p is an integer having the value 0 or 1 (i.e., including a single bond between a silicon atom of the silsesquioxane group and a carbon atom of a side group);

each $R_3$ is independently selected from any of hydrogen, halogen, linear or branched alkyl, linear or branched fluoroalkyl, cycloalkyl, fluorocycloalkyl, fluoroaryl, and any combination thereof; and $R_2$ and $R_3$ may optionally further include any of oxygen, sulfur or nitrogen, or any combination thereof.

In exemplary embodiments of the present invention, monomers having structure (II) may include, but are not limited to:

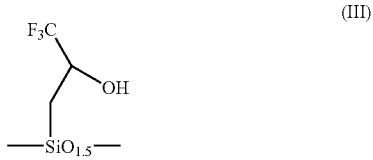
(III)

(IV)

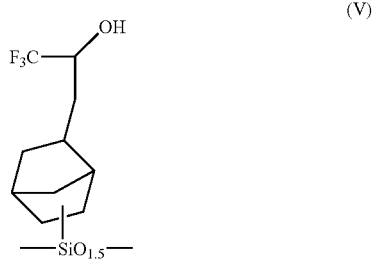
(V)

-continued (VI)
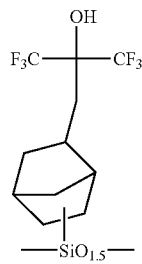

(VII)
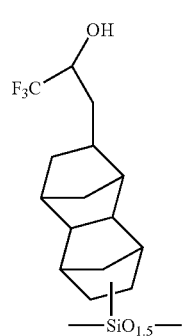

(VIII)
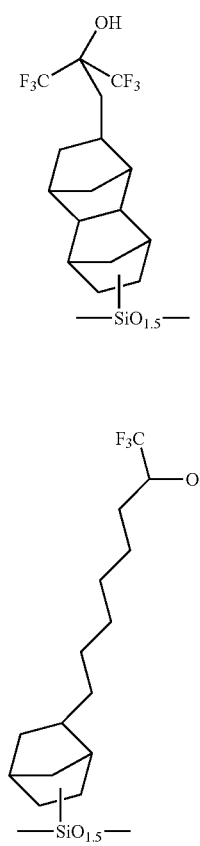

(IX)

-continued (X)
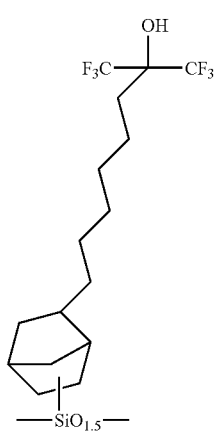

To tune the dissolution rates and n and k values of the TARC/barrier layer, the present invention may further comprise a monomer unit with the following structure:

(XI)

where $R_4$ comprises a polar organic moiety which may be selected from the group consisting of lactones, anhydrides, esters, ethers and alcohols, and fluorinated versions of such polar organic moieties; and x is from about 1 to about 1.95, more preferably from about 1 to about 1.75.

In exemplary embodiments of the present invention, monomers having structure (XI) may include, but are not limited to:

(XII)
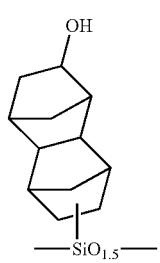

(XIII)
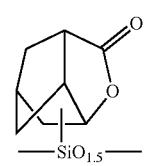

(XIV)
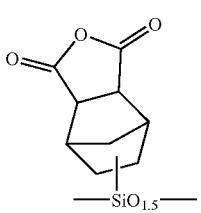

-continued

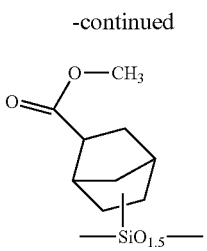
(XV)

To enhance the dissolution contrast of the resist under the TARC/barrier layer, the polymer of the present invention may further comprise a monomer unit with the following structure:

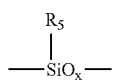
(XVI)

where $R_5$ comprises an acid labile moiety which may be selected from the group consisting of t-butylester, anhydrides, esters, ethers and alcohols, and fluorinated versions of such acid labile moieties; and x is from about 1 to about 1.95, more preferably from about 1 to about 1.75.

The structure of the acid-decomposable group in $R_5$ is represented by

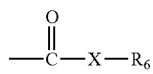
(XVII)

or

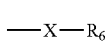
(XVIII)

where $R_6$ represents a tertiary alkyl group such as t-butyl group, 1-methylcyclopentyl, 1-ethylcyclopentyl, 1-methylcyclohexyl, and t-amyl group, 1-alkoxyethyl group such as isoboronyl group, 1-ethoxyethyl group, 1-butoxyethyl group, 1-isobutoxyethyl group and 1-cylohexyloxyethyl group, alkoxymethyl group such as 1-methoxymethyl group, 1-methoxypropyl, 1-methoxycyclohexyl and 1-ethoxymethyl group, 3-oxoalkyl group, tetrahydropyranyl group, tetrahydrofuranyl group, trialkylsilylester group, 3-oxocyclohexylester group, 2-methyl-2-adamantyl group, 2-methyl-2-isobornyl, 2-ethyl-2-tetracyclododecenyl, mevalonic lactone residue or 2-(γ-butyrolactonyloxycarbonyl)-2-propyl group; and X represents an oxygen atom, sulfur atom, —NH—, —NHSO₂— or —NHSO₂NH—.

In exemplary embodiments of the present invention, the monomer having structure (XVI) may include, but is not limited to:

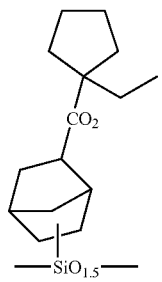
(XIX)

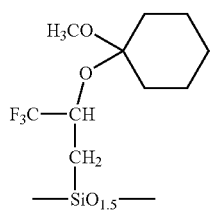
(XX)

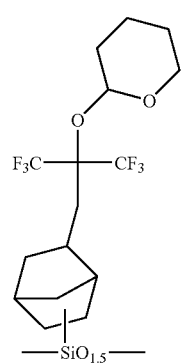
(XXI)

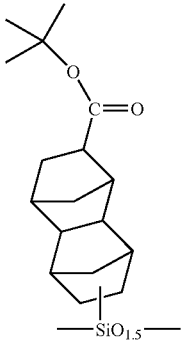
(XXII)

The TARC/barrier layer may further comprise at least one solvent which is preferably immiscible with the underlying photoresist material. Suitable solvents include, but are not limited to: 1-butanol, methanol, ethanol, 1-propanol, ethylene glycol, 1,2-butanediol, 1,3-butanediol, 1,4-butanediol, 1,2-propanediol, 1-methyl-2-butanol, 1-pentanol, 2-pentanol, 3-pentanol, 1-hexanol, 2-hexanol, 3-hexanol, 1-heptanol, 2-heptanol, 3-heptanol, 4-heptanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 2,4-dimethyl-3-pentanol, 3-ethyl-2-pentanol, 1-methylcyclopentanol, 2-methyl-1-hexanol, 2-methyl-2-hexanol, 2-methyl-3-hexanol, 3-methyl-3-hexanol, 4-methyl-3-hexanol, 5-methyl-1-hexanol, 5-methyl-2-hexanol, 5-methyl-3-hexanol, 4-methylcyclohexanol, and 1,3-propanediol.

The TARC/barrier layer of the invention is preferably insoluble in water but is soluble in aqueous base developer. Moreover, the top coat material is preferably substantially optically transparent to the exposure radiation for the underlying photoresist material, to allow patterning of the photoresist material.

It is also preferable that the TARC/barrier layer have a refractive index in the range of about 1.2 to 1.8. For 193 nm immersion lithography using water as the exposure medium, the refractive index of the top coat material is most preferably in the range of about 1.5 to 1.7.

In another aspect of the invention, the TARC/barrier layer may be used in a method of forming a patterned material layer on a substrate. The material layer may be, for example, a ceramic, dielectric, metal or semiconductor layer, such as those used in the manufacture of high performance integrated circuit devices and associated chip carrier packages. In the method, a photoresist composition is first deposited on the substrate by known means, to form a photoresist layer on the material. The substrate with the resist layer then may be baked, in a pre-exposure bake step, to remove any solvent from the photoresist composition and improve the coherence of the resist layer. Typical pre-exposure baking temperature is about 80 to about 150° C. Typical resist thickness is about 100 to about 500 nm.

Next, the TARC/barrier layer of the invention is applied on the photoresist layer, thereby forming a coated substrate. The coated substrate is then exposed to an appropriate irradiation source, through a patterned mask. In one exemplary embodiment, the imaging radiation is 193 nm radiation. In another embodiment, the imaging radiation is 157 nm radiation. In another embodiment, the imaging radiation is 248 nm radiation. The coated substrate also may be exposed to such imaging radiation using immersion lithography, wherein an imaging medium is applied to the coated substrate prior to exposure. In a preferred embodiment, the imaging medium is water.

The coated substrate is then contacted with an aqueous base developer, such as 0.263 N tetramethyl ammonium hydroxide (TMAH), thereby removing the top coat material and a portion of the photoresist layer simultaneously from the coated substrate. Contact with developer forms a patterned photoresist layer on the material layer.

The pattern in the photoresist layer then may be transferred to the material layer on the underlying substrate. Typically, the transfer is achieved by reactive ion etching or some other etching technique. The method of the invention may be used to create patterned material layer structures such as metal wiring lines, holes for contacts or vias, insulation sections (e.g., damascene trenches or shallow trench isolation), and trenches for capacitor structures, as might be used in the design of integrated circuit devices.

The processes for making these (ceramic, dielectric, metal or semiconductor) features generally involve providing a material layer or section of the substrate to be patterned, applying a layer of resist over the material layer or section, applying a top coat layer on the layer of resist, patternwise exposing the top coat and resist layers to radiation, developing the pattern by contacting the exposed top coat and resist with a developer, etching the layer(s) underlying the resist layer at spaces in the pattern whereby a patterned material layer or substrate is formed, and removing any remaining resist from the substrate. In some instances, a hard mask may be used below the resist layer to facilitate transfer of the pattern to a further underlying material layer or section. It should be understood that the invention is not limited to any specific lithography technique or device structure.

The typical thickness of the TARC/barrier layer is about 30-80 nm. In another embodiment of this invention, the TARC/barrier layer is applied to a thickness of about 1-4 μm to act as in an in situ pellicle to prevent particles or microbubbles from creating defects on resist. The thick top coat will also improve process window of photoresists.

The following non-limiting examples are provided to further illustrate the present invention. Because these examples are provided for illustrative purposes only, the invention embodied therein should be limited thereto.

EXAMPLE 1

Water Treatment Evaluation

Poly(2-hydroxy-3,3,3-trifluoropropylsilsesquioxane) was dissolved in 1-butanol to produce two solutions: 1.5 wt % solution and 5 wt % solution. These two solutions were then spin-coated on HMDS primed Si wafers, and the films were baked at 110° C. for 60 seconds.

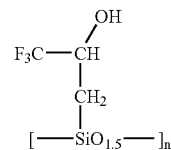

The following water solubility test was then conducted. The coated substrate was immersed in water for 3 minutes. Results are shown in Table 1. Thickness measured before and after immersion confirmed that there was no thickness loss of the TARC/barrier layer material in water. The slight variation is within the measurement error.

TABLE 1

Water treatment evaluation

| Polymer solid content | Thickness before water treatment (spin speed) | Thickness after water treatment for 3 minutes |
|---|---|---|
| 5% | 89.2 nm (1500 rpm) | 90 nm |
| 1.5% | 33.6 nm (2000 rpm) | 32.4 nm |

EXAMPLE 2

Active TARC/Barrier Layer Evaluation

Poly[2-hydroxy-3,3,3-trifluoropropylsilsesquioxane-co-5-(2-t-butoxycarbonyl)norbonylsilsesquioxane] was dissolved in 1-butanol to provide a solution having 1.5 wt % solid. This active ARC/barrier layer was applied over photoresist (AMX2073, from JSR) coated quartz disks. Photoresist thickness was around 280 nm. The films were baked at 110° C. for 60 seconds, and then flood exposed for 0.1 second with broadband DUV light using a flood exposure tool manufactured by Fusion System Corporation, Rockville, Md. After exposure, the quartz disks containing photoresist and active ARC/barrier layer were baked then developed in 0.263N TMAH and monitored with Research Quartz Crystal Microbalance (RQCM, RS-232) tool manufactured by Maxtek, Inc.

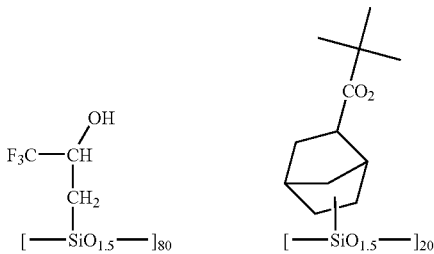

This experiment indicates when the whole assembly was baked at 110° C. for 60 seconds after exposure, the whole stack dissolved in less than one second. When the whole assembly was baked at 110° C. for 20 seconds after exposure, there was no dissolution for the first 1.5 seconds, and then the whole stack took 4.75 seconds to dissolve. The regular baking process after exposure for the resist alone is 110° C. for 60 seconds.

EXAMPLE 3

Optical Properties Evaluation

The TARC/barrier layer compositions prepared in Examples 1 and 2 were spin-coated on silicon wafers, baked on hot plate at 110° C. for 60 sec., then n and k values were measured with VB-250 VASE Ellipsometer manufactured by J. A. Woollam Co. Inc. The optical properties of the film for 193 nm radiation are as shown in Table 2 below.

TABLE 2

Optical properties evaluation

| Sample | Polymer Composition | n at 193 nm | k at 193 nm |
|---|---|---|---|
| Example 1 formulation | Poly(2-hydroxy-3,3,3-trifluoropropylsilsesquioxane) | 1.52 | 0.002 |
| Example 2 formulation | Poly[2-hydroxy-3,3,3-trifluoropropylsilsesquioxane-co-5-(2-t-butoxy-carbonyl)norbonylsilsesquioxane] | 1.51 | 0.0015 |

EXAMPLE 4

Lithographic Evaluation of TARC/Barrier Layer

Commercial 193 nm resist films and corresponding ARCs were spin cast on two 200 mm silicon wafers on a TEL ACT8 lithography processing track. The initial films were about 250 nm in thickness. The resist films were baked at 130° C. for 60 sec. On one of these wafers, the TARC material described in Example 1 (1.5 wt % solution of Poly(2-hydroxy-3,3,3-trifluoropropylsilsesquioxane)) above was spun onto the resist film at a thickness of 40 nm. The wafer was then baked at 110° C. for 60 sec.

Lithography exposures were performed on both wafers with a 193 nm 0.75 NA optical scanner, with conventional illumination and a partial coherence of 0.6. An attenuated phase shift test reticle was used with isolated line features of nominally 65 nm width. A post exposure bake was performed, and the resists were developed in 0.26 N TMAH developer. The TARC is also soluble in this developer, and was easily removed. Exposure dose was varied to find the proper anchor dose for these features and cross section SEMs were obtained. The SEM for the control wafer showed 193 nm lithography patterning of an isolated line without application of the TARC. The SEM for the second wafer showed an identical 193 nm lithography process with the TARC discussed above, and demonstrates that application of the topcoat does not affect the linewidth or lithography profile to any significant degree.

This example demonstrates successful 193 nm lithography with the TARC formulation discussed above. Note that this case is merely an example, and many other photoresists (including bilayer 193 nm resists) and processing conditions and equipment can be used with equal success.

While the present invention has been particularly described in conjunction with a specific preferred embodiment and other alternative embodiments, it is evident that numerous alternatives, modifications and variations will be apparent to those skilled in the art in light of the foregoing description. It is therefore intended that the appended claims embrace all such alternatives, modifications and variations as falling within the true scope and spirit of the present invention.

We claim:

1. A method of forming a patterned material layer on a substrate, the method comprising:
   providing a substrate having a material layer on a surface thereof;
   depositing a photoresist composition on the substrate to form a photoresist layer on the material layer;
   applying a top antireflective/barrier layer material on the photoresist layer, thereby forming a coated substrate, the top antireflective coating and barrier layer material comprising at least one silicon-containing moiety and at least one aqueous base soluble moiety;
   patternwise exposing the coated substrate to imaging radiation;
   removing simultaneously the top antireflective/barrier layer material and portions of the photoresist layer from the coated substrate, thereby forming a patterned photoresist layer on the material layer; and
   transferring the photoresist layer pattern to the material layer.

2. The method of claim 1, wherein the top antireflective/barrier layer material and portions of the photoresist layer are removed by contacting the resist layer with an aqueous alkaline developer.

3. The method of claim 2, wherein the aqueous alkaline developer is 0.263 N tetramethyl ammonium hydroxide.

4. The method of claim 1, wherein the material layer is selected from the group consisting of ceramic, dielectric, metal and semiconductor layer.

5. The method of claim 1, wherein the imaging radiation is 193 nm radiation.

6. The method of claim 1, wherein the imaging radiation is 157 nm radiation.

7. The method of claim 1, wherein the imaging radiation is 248 nm radiation.

8. The method of claim 1, further comprising, prior to patternwise exposing the coated substrate to imaging radiation, the step of applying an imaging medium to the coated substrate.

9. The method of claim 8, wherein the imaging medium is water.

10. The method of claim 1, wherein the photoresist layer pattern is transferred to the material layer by removing portions of the material layer not covered by the patterned photoresist layer.

11. The method of claim 10, wherein portions of the material layer are removed by etching the material layer in areas not covered by the patterned photoresist layer.

12. The method of claim 11, wherein portions of the material layer are removed using reactive ion etching.

13. The method of claim 1, wherein the top antireflective/barrier layer material has a thickness of about 1 to about 4 µm.

* * * * *